US010868209B2

United States Patent
Lim et al.

(10) Patent No.: US 10,868,209 B2
(45) Date of Patent: Dec. 15, 2020

(54) SENSOR ELEMENT

(71) Applicant: OSRAM Opto Semiconductors GmbH, Regensburg (DE)

(72) Inventors: Choon Kim Lim, Penang (MY); Choo Kean Lim, Penang (MY); Jeok Pheng Go, Penang (MY)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/488,068

(22) PCT Filed: Feb. 23, 2017

(86) PCT No.: PCT/EP2017/054234
§ 371 (c)(1),
(2) Date: Aug. 22, 2019

(87) PCT Pub. No.: WO2018/153464
PCT Pub. Date: Aug. 30, 2018

(65) Prior Publication Data
US 2020/0013917 A1 Jan. 9, 2020

(51) Int. Cl.
*H01L 31/16* (2006.01)
*H01L 31/02* (2006.01)
(Continued)

(52) U.S. Cl.
CPC ............ *H01L 31/16* (2013.01); *H01L 25/162* (2013.01); *H01L 25/18* (2013.01);
(Continued)

(58) Field of Classification Search
CPC ............. H01L 31/12; H01L 31/14–173; H01L 25/16–167; H01L 25/18; H01L 33/486;
(Continued)

(56) References Cited

U.S. PATENT DOCUMENTS

2009/0175026 A1  7/2009  Gueneau et al.
2011/0266559 A1  11/2011  Zitzlsperger et al.
(Continued)

FOREIGN PATENT DOCUMENTS

EP      2023397 A1    2/2009
JP      2012191016 A  10/2012

*Primary Examiner* — Scott B Geyer
(74) *Attorney, Agent, or Firm* — Slater Matsil, LLP

(57) ABSTRACT

A sensor element is disclosed. In an embodiment a sensor element includes a substrate, a light emitting semiconductor chip arranged with a mounting face on a mounting face of the substrate, wherein the semiconductor chip has a smaller mounting face than the substrate, wherein a border area of the mounting face of the substrate circumvents the semiconductor chip, wherein on a bottom side of the semiconductor chip electrical contacts are arranged, and wherein the substrate is transparent for radiation of the semiconductor chip, a carrier, wherein the bottom side of the semiconductor chip is arranged on a mounting face of the carrier, wherein the carrier includes further electrical contacts on the mounting face, and wherein the contacts of the semiconductor chip and the further contacts of the carrier are connected, a sealing member arranged between the mounting face of the carrier and the border area of the substrate, wherein the sealing member seals a sealing area between the substrate and the carrier, wherein a recess is arranged in the mounting face of the carrier, and an optical sensor arranged in the recess.

18 Claims, 2 Drawing Sheets

(51) Int. Cl.
  *H01L 31/0203* (2014.01)
  *H01L 31/167* (2006.01)
  *H01L 25/16* (2006.01)
  *H01L 25/18* (2006.01)
  *H01L 33/48* (2010.01)
  *H01L 31/09* (2006.01)

(52) U.S. Cl.
  CPC .... *H01L 31/0203* (2013.01); *H01L 31/02019* (2013.01); *H01L 31/09* (2013.01); *H01L 31/167* (2013.01); *H01L 33/486* (2013.01); H01L 2924/15153 (2013.01); H01L 2924/1632 (2013.01); H01L 2924/16251 (2013.01); H01L 2924/16315 (2013.01)

(58) Field of Classification Search
  CPC ........... H01L 31/09; H01L 2924/15153; H01L 2924/16251; H01L 2924/163–1632
  See application file for complete search history.

(56) References Cited

U.S. PATENT DOCUMENTS

| | | |
|---|---|---|
| 2012/0290255 A1 | 11/2012 | Kelkar et al. |
| 2014/0138812 A1 | 5/2014 | Sheu |
| 2016/0143148 A1* | 5/2016 | Hosomi ................. H01L 33/62 |
| | | 361/761 |
| 2016/0343927 A1* | 11/2016 | Yuasa ..................... H01L 24/05 |

* cited by examiner

SENSOR ELEMENT

This patent application is a national phase filing under section 371 of PCT/EP2017/054234, filed Feb. 23, 2017, which is incorporated herein by reference in its entirety.

TECHNICAL FIELD

The invention refers to a sensor element with a light emitting semiconductor chip and an optical sensor.

BACKGROUND

In the state of the art it is known to provide a sensor element with a light emitting semiconductor chip, wherein the semiconductor chip is arranged on a carrier. Furthermore, the sensor element comprises a separate optical sensor for receiving light of the semiconductor chip that is reflected by an object. The sensor is arranged on the carrier.

SUMMARY OF THE INVENTION

Embodiments provide an improved sensor element with a light emitting semiconductor chip and an optical sensor.

A basic advantage of the proposed sensor element is a simple structure that provides an efficient protection of the light emitting semiconductor chip and the optical sensor.

A sensor element with a light emitting semiconductor chip is provided. The semiconductor chip is arranged with a mounting face on a mounting face of the substrate. The semiconductor chip has a smaller mounting face than the substrate. A border area of the mounting face of the substrate circumvents the semiconductor chip. The semiconductor chip is embodied to generate electromagnetic radiation. On an upper side of the semiconductor chip electrical contacts are arranged. The substrate is transparent for the radiation of the semiconductor chip. An upper side of the semiconductor chip is arranged on a mounting side of a carrier. The carrier comprises further electrical contacts on the mounting side, wherein the contacts of the semiconductor chip and the contacts of the carrier are connected. The carrier comprises a recess with an optical sensor. Between the mounting side of the carrier and the border area of the substrate a sealing member is arranged. The sealing member seals a sealing area between the substrate and the carrier, wherein the semiconductor chip and the optical sensor are arranged in the sealing area. Therefore the semiconductor chip and the optical sensor are protected against environmental damage.

For example, the sealing member is dust-tight and/or fluid-tight and/or gas-tight. In an embodiment, the sealing area is hermetically closed. The electromagnetic radiation may comprise visible light, infrared light or ultraviolet light. Furthermore, the further contact elements may be guided through the carrier to a second contact side.

In a further embodiment, a height of the optical sensor is smaller than a depth of the recess of the carrier. Therefore a sensor element with small height is attained.

In a further embodiment, an electronic circuit is arranged in a further recess of the carrier, wherein the sensor is electrically connected with the electronic circuit. Therefore a compact sensor element is provided.

In a further embodiment, the carrier is made of not transparent material that absorbs light of the semiconductor chip. Therefore, direct crosstalk from the semiconductor chip to the optical sensor is reduced.

In a further embodiment, a second recess is arranged in the mounting face of the substrate within the sealing area and beside the semiconductor chip. The second recess is arranged between the semiconductor chip and the optical sensor along the x-axis. Therefore, the direct crosstalk between the semiconductor chip and the optical sensor can be further reduced.

In a further embodiment, the recess of the substrate is at least partially arranged above the recess of the carrier. For example, the recess of the substrate is arranged above the recess of the carrier and preferably covers the whole recess of the carrier.

In a further embodiment, the sealing member comprises a ring, wherein the ring surrounds the semiconductor structure, wherein the ring is connected with the substrate and with the carrier. The ring is a simple and reliably geometry for providing a sealing member. Furthermore the ring geometry can easily be formed.

In a further embodiment, the ring comprises metal. Metal provides suitable properties to form a robust sealing member.

In a further embodiment, the ring comprises a first metal layer that is arranged on the substrate, wherein the ring comprises a second metal layer that is arranged on the carrier, wherein the first and the second metal layer are connected. This embodiment can easily be produced and provides a reliable sealing member.

In a further embodiment, the sealing member comprises a sealing layer that fills up the sealing area. The sealing layer is a further appropriate sealing member that provides a sufficient sealing and a simple process. The sealing layer can be applied with a sealing ring. This increases the sealing stability and robustness. In a further embodiment, the sealing layer is made of silicone. Silicone can easily be processed and provides sufficient sealing properties.

In a further embodiment, the substrate is at least partially covered with a protective layer. This improves a long time stability of the substrate.

In a further embodiment, the protective coating comprises a self-cleaning coating or is made of a self-cleaning coating. This feature maintains a long time clean surface of the substrate. Therefore, the emitting of the radiation is not blocked or reduced by a dirt layer.

In a further embodiment, the self-cleaning coating is embodied to be activated by radiation of the semiconductor chip, especially by an ultraviolet light. This feature improves a simple structure and an efficient cleaning.

In a further embodiment, the carrier comprises electronic circuit for controlling the semiconductor chip. This feature assists a compact and small light emitting element. Furthermore wiring work is reduced.

In a further embodiment, the semiconductor chip is embodied to generate ultraviolet radiation. The proposed sealing is for this type of semiconductor chip advantageous because the proposed sealing is long time robust and provides a hermetic sealing.

A method for producing a light emitting element with a light emitting semiconductor chip is proposed. A semiconductor chip with a substrate and a light emitting semiconductor chip is provided. A carrier with a recess in a mounting side and an optical sensor arranged in the recess is provided. The upper side of the semiconductor chip is laid on a mounting side of a carrier, wherein the carrier comprises further electrical contacts on the mounting side, wherein the contacts of the semiconductor chip and the contacts of the carrier are connected. Between the mounting side of the carrier and the border area of the substrate a sealing member is formed. The sealing member seals a sealing area between the substrate and the carrier. The semiconductor chip and the recess with the optical sensor are arranged in the sealing area.

BRIEF DESCRIPTION OF THE DRAWINGS

The above-described properties, features and advantages of this invention and the way in which they are achieved will become clearer and more clearly understood in association with the following description of the exemplary embodiments which are explained in greater detail in association with the drawings. Here in schematic illustration in each case.

DETAILED DESCRIPTION OF ILLUSTRATIVE EMBODIMENTS

Figure 1:
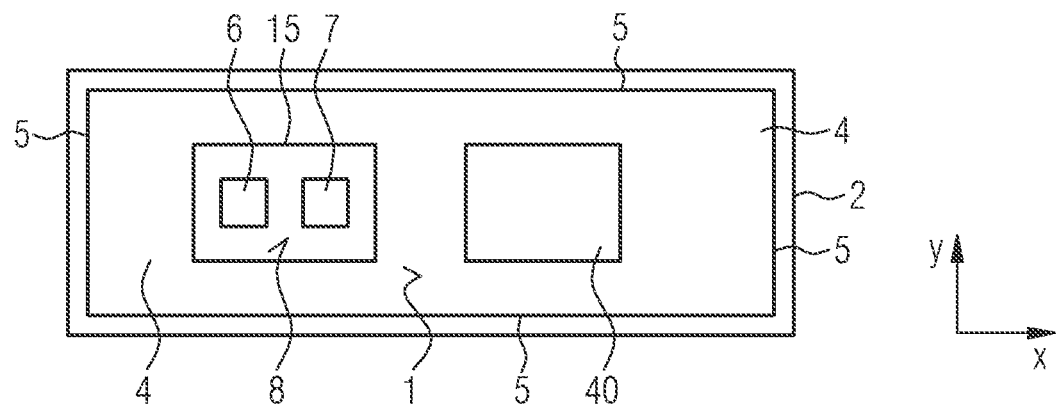
FIG. 1 shows a view on a substrate with a semiconductor chip.

FIG. 1 shows a schematic view on a semiconductor chip 15 with a substrate 2 in a y-x-plane. On a mounting face 1 of the substrate 2 a light emitting semiconductor chip 15 is arranged. The semiconductor chip 15 has a smaller size than the substrate 2. A circumferential border area 4 of the mounting face 1 of the substrate 2 is free from the semiconductor chip 15. On the border area 4 a first metal layer 5 is arranged. The first metal layer 5 surrounds the semiconductor chip 15. The first metal layer 5 is arranged with a given distance to the semiconductor chip 15.

The semiconductor chip 15 comprises a first and a second electrical contact 6, 7 that are arranged on a mounting face 8 of the semiconductor chip 15. The semiconductor chip 15 is embodied to generate electromagnetic radiation, for example, ultraviolet light, visible light or infrared light. Depending on the used embodiment, the semiconductor chip 15 comprises a semiconductor structure with layers of semiconductor material that form a p/n layer interface that is embodied to generate the electromagnetic radiation. For example, the semiconductor chip 15 is embodied as a light emitting diode. The semiconductor chip 15 may, for example, comprise a semiconductor material system with gallium nitride or indium gallium nitride.

In the shown embodiment, the mounting face 1 on the substrate 2 has a rectangular shape. Furthermore the mounting face 8 of the semiconductor chip 15 has also a rectangular shape. Depending on the used embodiment, the substrate 2 and/or the semiconductor chip 15 may have a different shape, for example, a quadratic or a circular shape. However the mounting face 8 of the semiconductor chip 15 is smaller than the mounting face 1 of the substrate 2. This is necessary to provide an area for the first metal layer 5 that surrounds the semiconductor chip 15 with a given distance to the semiconductor chip 15.

The substrate 2 is made of material that is transparent for the electromagnetic radiation that is generated by the semiconductor chip 15. For example, the substrate 2 is made of sapphire, silicon carbide, aluminum nitride, gallium nitride. The first metal layer 5 is embodied with a shape of four connected straight stripes. Depending on the used embodiment, the first metal layer 5 may also be embodied with the shape of a circular ring that surrounds the semiconductor chip 15.

The substrate 2 may comprise in an embodiment a recess 40 that is arranged in the mounting face 1 beside the semiconductor chip 15. The second recess 40 of the substrate 2 is arranged within an inner area that is surrounded by the first metal layer 5. The recess 40 may have the same or a larger or a smaller width along the y-axis as the semiconductor chip 15. The recess 40 may have a quadratic or a rectangular shape in the y-x-plane. Furthermore, the recess 40 may also have a different shape, for example, a circular shape in the y-x-plane. The recess 40 may be arranged with a small distance with respect to the semiconductor chip 15. The distance may be smaller than a length of the semiconductor chip along the x-axis.

The substrate 2 may also be embodied without a recess 40 having a plane mounting face 1.

Figure 2:
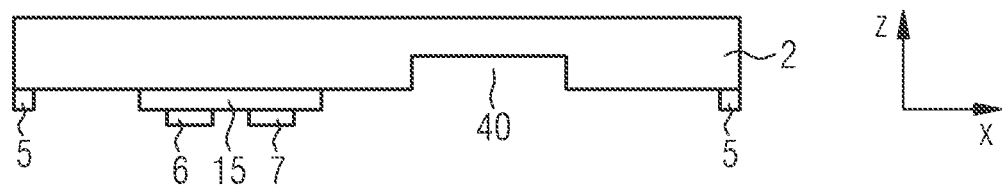
FIG. 2 shows a schematic cross sectional view of FIG. 1.

FIG. 2 shows a cross sectional view of the semiconductor chip 15 and the substrate 2 in a z-x-plane. The z axis and the y axis and the x axis constitute a rectangular coordinate system. A thickness of the substrate 2 along the z axis is larger than a thickness of the semiconductor chip 15 along the z axis. The recess 40 has a depth along the z-axis that is smaller than the thickness of the substrate 2 along the z-axis. For example, the recess 40 has a depth that is 5% or more, for example, 10% or more of the thickness of the substrate 2. For example, the recess 40 may have a depth that is more than 10% of the thickness of the substrate 2, for example, more than 20% or more than 40% of the thickness of the substrate 2.

Furthermore, the first metal layer 5 has a thickness that is along the z axis smaller than a width along the x axis. Furthermore, the first metal layer 5 may have a smaller thickness along the z-axis compared to the thickness of the semiconductor chip along the z-axis.

Figure 3:
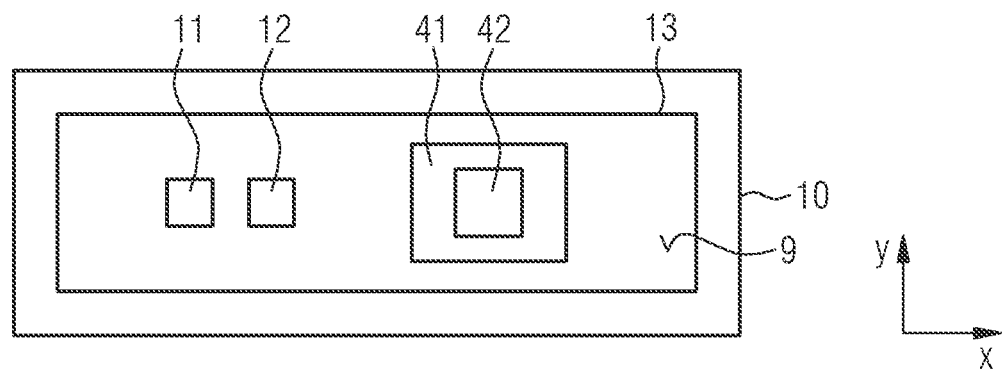
FIG. 3 shows a top view on a carrier with a sensor.

FIG. 3 shows a view on a mounting face 9 of a carrier 10 in a y-x-plane. The carrier 10 comprises on the mounting face 9 two further electrical contacts 11, 12. The carrier 10 comprises a recess 41 in the mounting face 9. An optical sensor 42 is arranged with in the recess 41. The optical sensor may be embodied to sense light that is emitted by the light emitting semiconductor chip 15. The optical sensor 42 may be, for example, embodied as a pin diode or as a photodiode. Depending on the used embodiment, the optical sensor 42 may have electronic circuits for evaluating a sensor signal of the optical sensor 42.

A second metal layer 13 is guided along a border area on the mounting face 9 of the carrier 10 surrounding the two further electrical contacts 11, 12 and the recess 41. The second metal layer 13 may have the same shape as the first metal layer 5 of the substrate 2. The second metal layer 13 may be made of the same material as the first metal layer 5 of the substrate 2. Furthermore, the further first and second electrical contacts 11, 12 may have the same size area as the first and second electrical contacts 6, 7 of the semiconductor chip 15. The carrier 10 may be embodied as a ceramic plate or a printed circuit board or a semiconductor plate.

Figure 4:
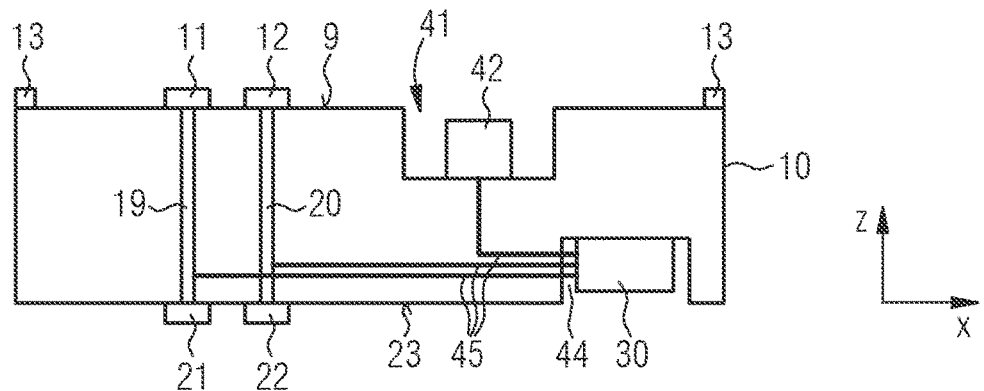
FIG. 4 shows a schematic cross sectional view of FIG. 3.

FIG. 4 shows a cross sectional view of the carrier 10 with the optical sensor 42 in the z-x-plane. The optical sensor 42 has a height along the z-axis that is smaller than a depth of the recess 41 along the z-axis. The further first and second electrical contacts 11, 12 are guided by via contacts 19, 20 to bottom contacts 21, 22 that are arranged at a bottom side 23 of the carrier 10. Depending on the used embodiment, the via contacts may also be guided to contacts that are arranged at side faces of the carrier 10. Furthermore, the carrier 10 may comprise at the bottom side 23 a further recess 44. In the further recess 44 an electronic circuit 30 is arranged. The electronic circuit may be embodied to evaluate the sensor signal of the optical sensor 42. In this embodiment, the electronic circuit 30 is electrically connected by a conductor line 45 with the optical sensor 42. Furthermore, the optical sensor 42 may be connected by conductor lines 45 with the further first and second contact 11, 12 and may be embodied to control the light emitting semiconductor chip 15. The electronic circuit 30 may comprise driver circuits and/or electric interface circuits for receiving signals from the optical sensor 42 and/or for controlling the semiconductor chip 15. In a further embodiment, the electronic circuit 30 may be arranged in a further recess 44 of the carrier 10 that is arranged within the carrier 10 and that is embodied as a closed further recess.

Figure 5:
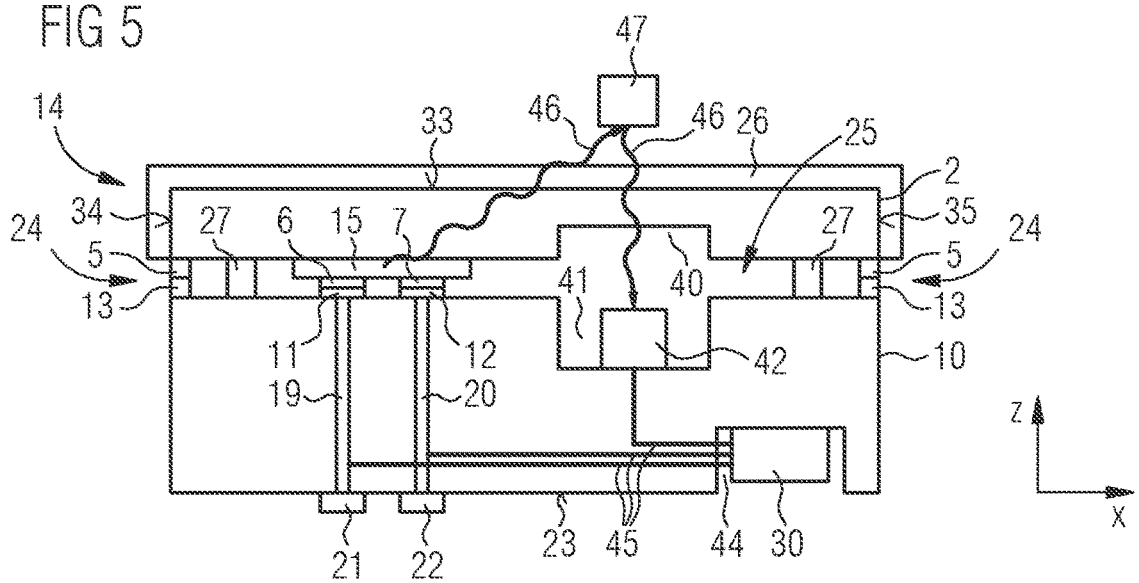
FIG. 5 shows a cross-sectional view of a sensor element.

FIG. 5 shows a cross sectional view in the z-x-plane of the sensor element 14 that comprises the semiconductor chip 15 of FIGS. 1 and 2 that is mounted on the carrier 10 with the optical sensor 42 of FIGS. 3 and 4. The first and the second metal layer 5, 13 are directly connected. The connection between the first and the second metal layer 5, 13 may be formed by a metal bonding process. In a further embodiment, the first and the second metal layer 5, 13 may be connected by a third metal layer. The third metal layer may comprise solder material, for example, AuSn or SnAgCu. Furthermore, the first and the second metal layer 5, 13 may be made of solder material, for example, AuSn or SnAgCu. Furthermore, the electrical contacts 6, 7 are directly connected with the further first and second electrical contacts 11, 12. Furthermore, the electrical contacts 6, 7 are connected with the further first and second electrical contacts 11, 12 by contact layers. The contact layers may comprise solder, for example, AuSn or may be made of AuSn.

The first metal layer 5 and the second metal layer 13 constitute a sealing member 24 that seals a sealing area 25 between the substrate 2 and the carrier 10. The semiconductor chip 15 is arranged in the sealing area 25. The recess 41 of the carrier 10 is arranged with the sealing area 25. If there is a recess 40 in the substrate 2, then also the recess 40 of the substrate 2 is arranged within the sealing area 25. The recess 40 has the advantage that less light is directly sent from the light emitting semiconductor chip 15 to the optical sensor 42. The sensor element 14 is embodied to send light 46 from the semiconductor chip 15 via the transparent substrate 2 to an object 47. The object 47 reflects the light 46 back via the substrate 2 to the optical sensor 42. Since the carrier 2 is not transparent for the light of the semiconductor chip 15 and the optical sensor 42 is arranged in the recess 40, less or no light is directly sent from the semiconductor chip 15 to the optical sensor 42. Furthermore, the recess 40 in the substrate 2 reduces the cross talk of directly sending light from the semiconductor chip 15 to the optical sensor 42. The recess 40 of the substrate 2 may have the same shape or a larger shape than the recess 41 of the carrier 10. The recess 40 of the substrate 2 may have a smaller shape than the recess 41 of the carrier 10. Depending on the used embodiment, the recess 40 of the substrate 2 is arranged above the optical sensor 42. For example, a middle of the recess 40 of the substrate 2 is arranged above a middle of the sensor 42. The recess 40 of the substrate 2 may have a smaller length along the x-axis than the recess 41 of the carrier 10 and the recess 40 of the substrate 2 may have the same or a larger width along the y-axis than the recess 41 of the carrier 10.

Furthermore, depending on the used embodiment the recess 40 of the substrate 2 may have the shape of a part of a spherical shape.

The sealing member 24 constitutes a sealing ring, wherein the sealing ring surrounds the sealing area. The sealing ring 24 seals the sealing area 25 from the environment. Depending on the used embodiment, the sealing ring 24 is embodied to hermetically seal the sealing area 25 from the environment. Therefore, the semiconductor chip 15 that may comprise epitaxial deposited semiconductor layers is protected against the environment. The electromagnetic radiation that is generated by the semiconductor chip 15 is emitted through the substrate 2. The sealing ring 24 may provide an hermetic seal of the sealing area 25.

The sensor element 14 provides a robust package with hermetic requirements for the semiconductor chip 15 and the optical sensor 42. Especially by using sapphire as a substrate 2, the sensor element 14 is extremely robust against environmental damage. A protective layer 26 may be arranged on the face of the substrate 2, especially if aluminum nitride or gallium nitride is used as substrate 2. The protective layer 26 may, for example, be made of silicon oxide. Furthermore, the protective layer 26 may also be embodied as an anti-reflective layer or comprise an anti-reflective layer. However, depending on the used embodiment, the protective layer 26 can be omitted.

In a further embodiment of the sensor element 14, the substrate 2 is covered by a protective layer 26 that comprises or is embodied as a self-cleaning coating. The self-cleaning coating may comprise or consist of a photocatalyst material, for example, titan oxide. For example, the photocatalyst material may be embodied as a sol-gel layer. A sol-gel process is a method for producing solid materials from small molecules. The method is used for the fabrication of metal oxides, especially the oxides of silicon and titanium. The process involves conversion of monomers into a colloidal solution (sol) that acts as the precursor for an integrated network (or gel) of either discrete particles or network polymers.

The self-cleaning coating 26 may cover a top face 33 and all side faces 34,35 of the substrate 2. The self-cleaning coating 26 may, for example, comprise or be made of nano-layers of titanium oxide TiO2. The self-cleaning coating 26 may be embodied to be activated by the light of the semiconductor chip 15, for example, by ultraviolet light that is emitted by the semiconductor chip 15. The self-cleaning coating 26 improves a robustness of the sensor element 14, wherein an organic deposition could be decomposed with ultraviolet radiation using a photocatalytic cleaning process. The sensor element 14 could be arranged inside an exhaust pipe of a combustion engine and the organic decomposition on the substrate 2 caused by incomplete combustion could be reduced significantly by the self-cleaning coating 26.

In a further embodiment instead of the first and second metal layer 5,13 or additional to the first and second metal layer 5,13 a sealing layer 27 may be embodied that surrounds the sealing area 25. The sealing layer 27 may have the same shape as the sealing member 24.

In a further embodiment, the a sealing layer 27 is arranged between the mounting face 1 of the substrate 2 and the mounting face of the carrier 10 in the sealing area 25. The sealing layer 27 seals the semiconductor chip 15 and the optical sensor 42. The semiconductor chip 15 and/or the optical sensor 42 are, for example, hermetically encapsulated in the sealing layer 27. The sealing layer 27 may be made of silicone, epoxy or polymer or a hybrid material comprising silicone and epoxy material.

Depending on the used embodiment, additionally to the sealing layer 27 also a sealing ring 24 may be arranged as shown in FIG. 5 surrounding the sealing layer 27. In this embodiment, there is a double protection for the semiconductor chip 15 and the optical sensor 42 with a sealing layer 27 and a sealing ring 24. However the sealing ring 24 can be omitted.

In a further embodiment, the sensor element 14 has a top face 33 of the substrate 2 that comprises a rough surface with a rough structure that increases light extraction from the substrate 2. The rough surface may be embodied by recesses or projections with a shape of a pyramid or an inversed pyramid. Also other shapes for the recesses or projections are possible. For example, the rough surface may comprise cylinder holes or rectangular holes to increase the light extraction from the substrate 2. The rough surface may comprise micro pits or nano pits or micro structures or nano structures to enhance the light extraction.

The semiconductor chip 15 may comprise an epitaxial semiconductor layer structure. The proposed sensor element 14 provides a low-loss package especially for ultraviolet light emitting semiconductor diodes. A small and thin package can be achieved. Furthermore, a robust package with hermetic requirements is provided. Additionally, anti-reflective coating may be arranged on external surfaces of the substrate 2. This improves an overall package performance.

Figure 6:
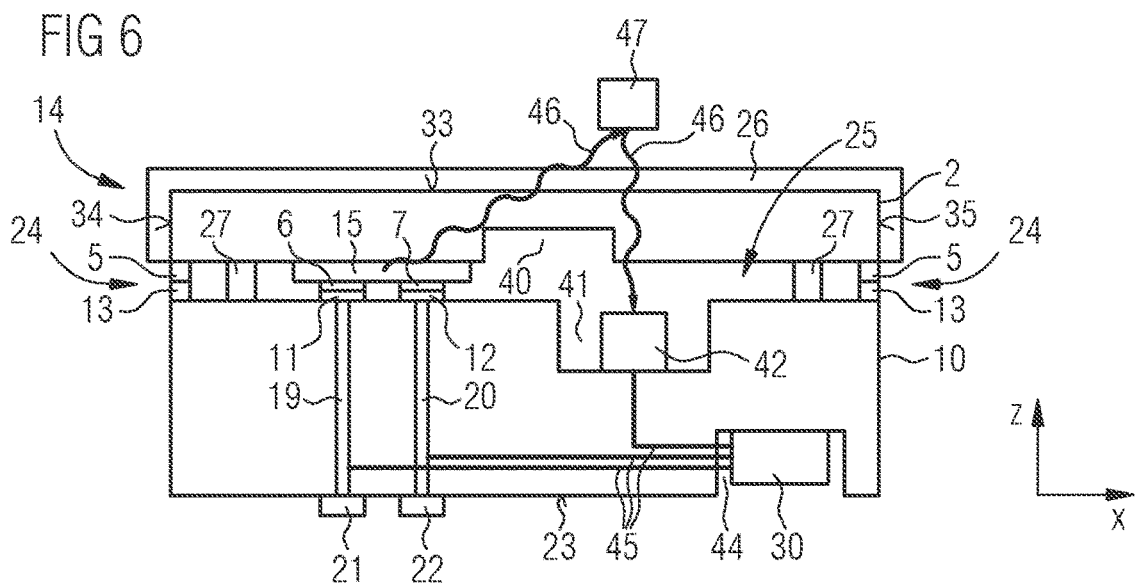
FIG. 6 shows a cross-sectional view of a further embodiment of a sensor element.

In a further embodiment, the recess 40 of the substrate 2 may be at least partially arranged in a position along the x-axis between the optical sensor 42 and the semiconductor chip 15 as shown in FIG. 6. FIG. 6 shows a sensor element 14 that is basically embodied as the sensor element 15 of FIG. 5. The recess 40 of the substrate 2 is not directly arranged above the sensor 42, but between the semiconductor chip 15 and the optical sensor 42 with respect to the x-axis. The recess 40 of the substrate 2 may be arranged partially or totally above the recess 41 of the carrier 10. Depending on the used embodiment, the recess 40 of the substrate 2 may cover the whole recess of the carrier 10. In a further embodiment, the recess 40 of the substrate 2 may be totally arranged beside the recess 41 of the carrier 10 between the semiconductor chip 15 and the recess 41 of the carrier 10.

The invention has been illustrated and described in detail with the aid of the preferred exemplary embodiments. Nevertheless, the invention is not restricted to the examples disclosed. Rather, other variants may be derived therefrom by a person skilled in the art without departing from the protective scope of the invention.

The invention claimed is:

1. A sensor element comprising:
   a substrate;
   a light emitting semiconductor chip arranged with a mounting face on a mounting face of the substrate,
   wherein the semiconductor chip has a smaller mounting face than the substrate,
   wherein a border area of the mounting face of the substrate circumvents the semiconductor chip,
   wherein on a bottom side of the semiconductor chip electrical contacts are arranged, and
   wherein the substrate is transparent for radiation of the semiconductor chip,
   a carrier,
   wherein the bottom side of the semiconductor chip is arranged on a mounting face of the carrier,
   wherein the carrier comprises further electrical contacts on the mounting face, and
   wherein the contacts of the semiconductor chip and the further contacts of the carrier are connected;
   a sealing member arranged between the mounting face of the carrier and the border area of the substrate,
   wherein the sealing member seals a sealing area between the substrate and the carrier,
   wherein the semiconductor chip is arranged in the sealing area,
   wherein a recess is arranged in the mounting face of the carrier, and
   wherein the recess is arranged beside the semiconductor chip and within the sealing area; and
   an optical sensor arranged in the recess.

2. The sensor element of claim 1, wherein a height of the optical sensor is smaller than a depth of the recess of the carrier.

3. The sensor element of claim 1, further comprising an electronic circuit arranged in a further recess of the carrier, wherein the optical sensor is electrically connected with the electronic circuit.

4. The sensor element of claim 1, wherein the carrier is not transparent and is configured to absorb the radiation of the semiconductor chip.

5. The sensor element of claim 1, wherein a recess is arranged in the mounting face of the substrate within the sealing area and beside the semiconductor chip, and wherein the recess of the substrate is arranged at least partially between the semiconductor chip and the recess of the carrier.

6. The sensor element of claim 5, wherein the recess of the substrate is at least partially arranged above the recess of the carrier.

7. The sensor element of claim 1, wherein the substrate is made of sapphire and/or the carrier is made of ceramic.

8. The sensor element of claim 1, wherein the optical sensor is configured to sense ultraviolet light.

9. The sensor element of claim 1, wherein the semiconductor chip is a light emitting diode.

10. The sensor element of claim 1, wherein the sealing member comprises a ring, wherein the ring surrounds the semiconductor chip and the recess of the carrier, and wherein the ring is connected with the substrate and with the carrier.

11. The sensor element of claim 10, wherein the ring comprises a first metal layer that is arranged on the substrate and a second metal layer that is arranged on the carrier, and wherein the first and second metal layers are connected.

12. The sensor element of claim 1, wherein the substrate comprises a protective layer comprising a self-cleaning coating.

13. The sensor element of claim 12, wherein the self-cleaning coating is configured to be activated by the radiation of the semiconductor chip.

14. The sensor element of claim 1, wherein the carrier comprises an electronic circuit configured to evaluate a measurement of the optical sensor.

15. A sensor element comprising:
   a substrate;
   a light emitting semiconductor chip arranged with a mounting face on a mounting face of the substrate,
   wherein the semiconductor chip has a smaller mounting face than the substrate,
   wherein a border area of the mounting face of the substrate circumvents the semiconductor chip,
   wherein on a bottom side of the semiconductor chip electrical contacts are arranged, and
   wherein the substrate is transparent for radiation of the semiconductor chip;
   a carrier,
   wherein the bottom side of the semiconductor chip is arranged on a mounting face of the carrier, wherein the carrier comprises further electrical contacts on the mounting face,
wherein the contacts of the semiconductor chip and the further contacts of the carrier are connected, and
wherein a recess is arranged in the mounting face of the carrier;
a sealing member arranged between the mounting face of the carrier and the border area of the substrate,
wherein the sealing member seals a sealing area between the substrate and the carrier,
wherein the semiconductor chip is arranged in the sealing area, and
wherein the recess is arranged beside the semiconductor chip and within the sealing area;
an optical sensor arranged in the recess,
wherein a height of the optical sensor is smaller than a depth of the recess of the carrier; and
an electronic circuit arranged in a further recess of the carrier,
wherein the optical sensor is electrically connected with the electronic circuit,
wherein the carrier is not transparent and is configured to absorb the radiation of the semiconductor chip,
wherein the optical sensor is configured to sense ultraviolet light, and
wherein the semiconductor chip is a light emitting diode.

16. The sensor element of claim 15, further comprising a ring, wherein the ring comprises a first metal layer that is arranged on the substrate and a second metal layer that is arranged on the carrier, and wherein the first and second metal layers are connected.

17. A sensor element comprising:
a substrate;
a light emitting semiconductor chip,
wherein the semiconductor chip is arranged with a mounting face on a mounting face of the substrate,
wherein the semiconductor chip has a smaller mounting face than the substrate,
wherein a border area of the mounting face of the substrate circumvents the semiconductor chip,
wherein on a bottom side of the semiconductor chip electrical contacts are arranged,
wherein the substrate is transparent for radiation of the semiconductor chip;
a carrier,
wherein the bottom side of the semiconductor chip is arranged on a mounting face of the carrier,
wherein the carrier comprises further electrical contacts on the mounting face, and
wherein the contacts of the semiconductor chip and the further contacts of the carrier are connected;
a sealing member arranged between the mounting face of the carrier and the border area of the substrate,
wherein the sealing member seals a sealing area between the substrate and the carrier,
wherein the semiconductor chip is arranged in the sealing area,
wherein a recess is arranged in the mounting face of the carrier, and
wherein the recess of the carrier is arranged beside the semiconductor chip and within the sealing area; and
an optical sensor arranged in the recess,
wherein the optical sensor is configured to sense ultraviolet light,
wherein the semiconductor chip is a light emitting diode,
wherein the sealing member comprises a ring,
wherein the ring surrounds the semiconductor chip and the recess of the carrier, and
wherein the ring is connected with the substrate and with the carrier.

18. The sensor element of claim 17, wherein the ring comprises a first metal layer that is arranged on the substrate and a second metal layer that is arranged on the carrier, and wherein the first and second metal layers are connected.

* * * * *